(12) United States Patent
Chiba et al.

(10) Patent No.: US 7,375,661 B2
(45) Date of Patent: May 20, 2008

(54) IMAGE CODING APPARATUS, VARIABLE-LENGTH CODING APPARATUS, CONTROL APPARATUS AND METHOD THEROF

(75) Inventors: Yukio Chiba, Kanagawa (JP); Katsumi Otsuka, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 1472 days.

(21) Appl. No.: 10/245,766

(22) Filed: Sep. 18, 2002

(65) Prior Publication Data
US 2003/0058143 A1 Mar. 27, 2003

(30) Foreign Application Priority Data
Sep. 27, 2001 (JP) ............................. 2001-297439
Jun. 19, 2002 (JP) ............................. 2002-178935

(51) Int. Cl.
*H03M 7/40* (2006.01)
(52) U.S. Cl. ........................ 341/67; 341/65; 341/58; 341/59
(58) Field of Classification Search ................. 341/65, 341/67, 58, 59
See application file for complete search history.

(56) References Cited

U.S. PATENT DOCUMENTS

| | | | | |
|---|---|---|---|---|
| 5,140,621 A | * | 8/1992 | Perron et al. | 375/240 |
| 5,479,166 A | * | 12/1995 | Read et al. | 341/65 |
| 5,512,896 A | * | 4/1996 | Read et al. | 341/65 |
| 5,623,423 A | * | 4/1997 | Lipovski | 708/203 |
| 5,706,460 A | * | 1/1998 | Craig et al. | 712/204 |
| 5,809,306 A | * | 9/1998 | Suzuki et al. | 717/143 |
| 5,822,558 A | * | 10/1998 | Tran | 712/213 |
| 5,828,784 A | * | 10/1998 | Miyashita et al. | 382/232 |
| 6,470,376 B1 | * | 10/2002 | Tanaka et al. | 718/108 |
| 7,180,968 B2 | * | 2/2007 | Miyauchi et al. | 375/341 |
| 7,197,686 B2 | * | 3/2007 | Box et al. | 714/759 |
| 2003/0088821 A1 | * | 5/2003 | Yokokawa et al. | 714/788 |

OTHER PUBLICATIONS

U.S. Appl. No. 10/021,247, filed Dec. 19, 2001.
U.S. Appl. No. 10/067,223, filed Feb. 7, 2002.
U.S. Appl. No. 10/073,112, filed Feb. 12, 2002.
U.S. Appl. No. 10/163,596, filed Jun. 7, 2002.

* cited by examiner

*Primary Examiner*—Linh Nguyen
(74) *Attorney, Agent, or Firm*—Fitzpatrick, Cella, Harper & Scinto

(57) ABSTRACT

A variable-length coding apparatus having a smaller circuit scale, which flexibly handles identifier insertion processing in correspondence with various coding schemes, and which performs fine code amount control and adaptive erroneous operation control, and an image coding apparatus having the variable-length coding apparatus. The variable-length coding apparatus converts quantized data obtained by quantizing image data into variable-length code data, generates a code data string having a predetermined data structure, and inserts padding bits and identifier into the variable-length code data based on an externally-input instruction. Further, the image coding apparatus having the variable-length coding apparatus changes quantization values based on the total code amount of code data string generated by the variable-length coding apparatus.

8 Claims, 13 Drawing Sheets

IMAGE CODING APPARATUS, VARIABLE-LENGTH CODING APPARATUS, CONTROL APPARATUS AND METHOD THEROF

FIELD OF THE INVENTION

The present invention relates to an image coding apparatus, and more particularly, to a variable-length coding apparatus which converts symbols into a code data string.

BACKGROUND OF THE INVENTION

Conventionally, the JPEG system, standardized by the ISO (International Organization for Standardization) is widely used as a coding scheme for storing a still image on a storage medium such as a CD-ROM or hard disk and displaying the image. A still image coded by the JPEG method includes a header portion having information necessary for decoding such as an image size and sampling coefficients of color components, and an entropy coded image data portion (ECS).

Regarding the ECS portion, in a block interleave scheme for repeatedly encoding color components by 8×8 pixel block, the minimum unit in all the coded color component blocks based on sampling coefficients is called a minimum coding unit (MCU). For example, in an image with luminance Y, color chrominance Cb and Cr as color components, and the sampling coefficients at a ratio of 4:2:2, 4 blocks (Y, Y, Cb, Cr) constitute 1 MCU.

On the other hand, an identifier called "restart marker" can be added to the ECS portion at MCU-based arbitrary periods. When a code data string including an error due to some reason is decoded, the influence of the error can be suppressed in the restart marker period. As the location of the restart marker is defined in the byte boundary of the ECS, if the MCU within an ECS immediately prior to insertion of the restart marker is not ended at the byte boundary, plural (1 to 7 bits) "1", called "padding bits", are inserted within the ECS then the restart marker is inserted.

Further, the MPEG system, standardized by the ISO is widely used as a coding scheme for storing a moving image on a storage medium such as a CD-ROM or hard disk and displaying the image, and for broadcasting or bidirectional communication using a moving image via a communication path. A moving image coded by the MPEG method includes a header portion having information necessary for decoding such as an image size and quantization scaling value for quantization and uniform scaling of respective pixels, and an entropy-coded image data portion (macro block).

The macro block structure limited by the MPEG system has a size of 16 pixels×16 pixels, and has color components including luminance Y and chrominance Cb and Cr. The respective color components are subsampled at the ratio of 4:1:1 by 8×8 pixel block.

On the other hand, the MPEG system has a processing unit called a slice including plural macro blocks, and a layer having plural slices is called a slice layer. As an identifier called slice start code is always exists in the byte boundary at the head of slice, if a code data string including an error due to some reason is decoded, the influence of the error can be suppressed in the slice period. If one slice is not ended in the byte boundary, plural (1 to 7 bits) "0", called "padding bits", are inserted within the code data string then the slice start code is inserted.

In recent years, some image coding apparatuses generate a code data string in cooperation with a main control unit used in a system including the image coding apparatus or a specialized main control unit in the image coding apparatus. In such arrangement, generally, the main control unit which can perform flexible processing generates the header portion, and a specialized hardware generates the ECS or macro block portion at a high speed.

FIG. 9 shows an example of conventional image coding apparatus in conformity to the JPEG or MPEG system. First, a header portion outputted from a main control unit 10, in which a control method can be changed by stored software, is selected by a selector 600 and outputted to the outside. Then, image data input is started, and coding is performed on the ECS or macro block portion. The input image data is converted by a DCT unit 200 into DCT coefficients, then the DCT coefficients are quantized by a quantization unit 300, and converted by a run-length coding unit 400 into symbols of run-length and level. Finally, the symbols are variable-length encoded by a variable-length encoder 500, then padding bits and identifier are inserted in the data, then selected by the selector 600 and outputted as the ECS or macro block portion to the outside.

In the conventional image coding apparatus, as the variable-length encoder 500 inserts an identifier such as the restart marker or slice start code which differs by coding scheme into the variable-length coded data string, the apparatus has means for generating these identifiers, means for adding appropriate padding bits to the generated restart marker or slice start code and means for inserting the restart marker or slice start code to which the padding bits are added into the variable-length coded data string, as specialized hardware devices. Thus the circuit scale of the apparatus is large.

Further, to insert other identifiers, e.g., in the JPEG system, an EOI marker indicating the end of code data string or a DNL marker re-defining the number of input image lines, or in the MPEG system, a picture header necessary in a picture layer constructing one image which is a higher-order layer of the slice layer, into the code data string, hardware devices for the respective identifiers are required. Thus it is difficult to perform flexible identifier insertion processing.

Further, in the conventional image coding apparatus, once coding of ECS in the JPEG system or picture layer in the MPEG system is started, the apparatus self-operates until the coding of all the symbols are completed in the variable-length encoder 500. Accordingly, upon code amount control, even if the amount of generated code exceeds a target amount, the amount of generated code cannot be evaluated before completion of coding of all the ECS portion or picture layer.

Further, in the conventional image coding apparatus, in the event of mishap in coding due to some factor during coding of ECS in the JPEG system or picture layer in the MPEG system, it is difficult to detect the mishap and perform adaptive control.

SUMMARY OF THE INVENTION

The present invention has been made in consideration of the above problems, and has its object to provide a variable-length coding apparatus having a smaller circuit scale, which flexibly handles identifier insertion processing in correspondence with various coding schemes, and which performs fine code amount control and adaptive erroneous operation control, and an image coding apparatus having the variable-length coding apparatus.

To attain the foregoing object, the variable-length coding apparatus of the present invention has the following construction. That is, provided is a variable-length coding apparatus which converts quantized data obtained by quantizing image data into variable-length code data and generates a code data string having a predetermined data structure, comprising: coding scheme storage means for storing a coding scheme of said code data string; written data storage means for storing externally-input written data formed with an identifier or a combination of padding bit and identifier; selection means for selecting said written data if the written data is written into said written data storage means, otherwise, selecting said variable-length code data; data combination means for combining data selected by said selection means and generating a data string; number of bits storage means for storing the number of bits of said externally-input written data; and number of significant bits control means for calculating the number of significant bits in the data string generated by said data combination means and outputting the number as a signal to outside.

Other features and advantages of the present invention will be apparent from the following description taken in conjunction with the accompanying drawings, in which like reference characters designate the same name or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

First Embodiment

<Coding Processing by Variable-Length Coding Apparatus and Main Control Unit>

Figure 1:
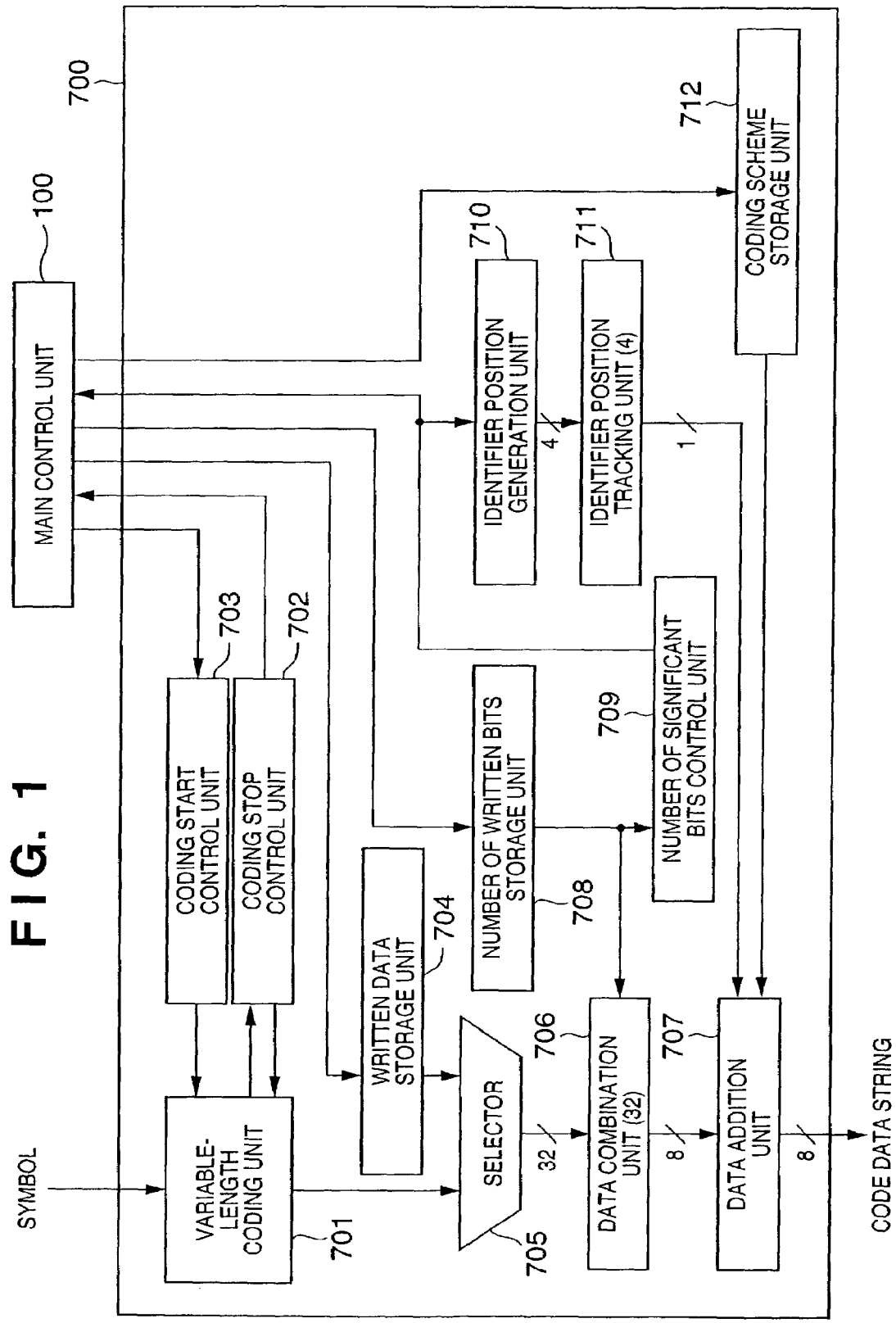
FIG. 1 is a block diagram showing an image coding apparatus according to a first embodiment of the present invention.

FIG. 1 shows a variable-length coding apparatus and a main control unit according to a first embodiment of the present invention. In the variable-length coding apparatus in FIG. 1, reference numeral 701 denotes a variable-length coding unit which performs variable-length coding on a symbol of level and run-length generated by a run-length coding unit; and 702, a coding stop control unit which stops coding processing based on the number of symbols processed by the variable-length coding unit 701, and informs the main control unit 100 of the stoppage of coding processing by the variable-length coding unit 701.

Further, numeral 703 denotes a coding start control unit which instructs the variable-length coding unit 701 from the main control unit 100 to start the coding processing; and 704, a written data storage unit in which data written from the main control unit 100 is stored.

Further, numeral 705 denotes a selector which selects one of variable-length code data outputted from the variable-length coding unit 701 or data outputted from the written data storage unit 704; and 706, a 32-bit length data combination unit for connection of data selected by the selector 705.

Further, numeral 707 denotes a data addition unit which adds a particular data pattern to an identifier if it detects a pattern identical to the identifier in a data string outputted from the data combination unit 706; 708, a number of written bits storage unit in which the number of bits of data, written from the main control unit 100 into the data combination unit 706, is stored; 709, a number of significant bits control unit which counts and stores the number of significant bits in the data combination unit 706; 710, an identifier position generation unit which generates 4-bit identifier position information indicating the position of identifier, written from the main control unit 100 through the written data storage unit 704 and the selector 705, in the 32-bit length data combination unit 706; and 711, an identifier position tracking unit which tracks the 4-bit identifier position information outputted from the identifier position generation unit 710 based on the operation of the data combination unit 706.

Further, numeral 712 denotes a coding scheme storage unit used for notifying the coding scheme of processing object image such as JPEG or MPEG scheme, from the main control unit 100 to the variable-length encoder 700.

First, a still image coding processing by the JPEG scheme in the present embodiment will be described.

Prior to all the coding operation, the JPEG scheme is set as a coding scheme for the processing object image in the coding scheme storage unit 712.

First, the entire flow of generation of code data string by the variable-length encoder 700 from symbols generated by the run-length coding unit will be described. The variable-length coding unit 701 variable-length encodes symbols and generates variable-length code data. The selector 705 selects the variable-length code data or data written into the data storage unit 704 (including an identifier) and outputs the selected data to the data combination unit 706.

The data combination unit 706 connects sequentially-outputted variable-length code data or the like (variable-length code data, identifier or the like) and outputs the data by predetermined data length such as 1 byte to the data addition unit 707. The data addition unit 707 is notified from the coding scheme storage unit 712 that the processing object image is in conformity to the JPEG scheme. When the data addition unit 707 detects a data pattern specific to the JPEG scheme, 0×FF (8-bit length) in the variable-length code data sequentially outputted from the data combination unit 706 within a byte boundary, adds 0×00 (8-bit length) immediately behind the data pattern. By this addition, the variable-length code data 0×FF (8-bit length) and the data pattern 0×FF (8-bit length) specific to the identifier defined by the JPEG scheme can be discriminated from each other upon decoding.

Next, a procedure by the variable-length encoder 700 for inserting an identifier into a variable-length code data under an instruction from the main control unit 100 will be described with reference to the flowchart of FIG. 2. In this example, an identifier which is called restart marker in the JPEG scheme and which is inserted in a code data string by predetermined symbols will be described. Note that the interval of symbols between inserted restart markers is called restart interval.

First, in accordance with an instruction from the main control unit 100, count value 1 and count value 2 counted by the coding stop control unit 702 are initialized (steps S1001 and S1002), and the restart interval is set.

When the initialization of the count values 1 and 2 and setting of the restart interval have been completed, the main control unit 100 outputs a coding processing start command. The variable-length coding unit 701 receives the command via the coding start control unit 703, and starts variable-length coding. The variable-length coding in the variable-length coding unit 701 is performed on the symbols generated by the run-length coding unit by MCU (by minimum coding unit) (step S1003).

On the other hand, every time the variable-length coding unit 701 variable-length encodes the symbols by MCU, the coding stop control unit 702 increments the count values 1 and 2 by one (step S1004).

Further, the count value 2 and the restart interval are compared with each other, and if the count value 2 is less than the restart interval, the process returns to step S1003 to repeat the variable-length coding by MCU.

On the other hand, if the count value 2 is equal to or greater than the restart interval, the coding stop control unit 702 issues a stop command to the variable-length coding unit 701 so as to stop the variable-length coding, and outputs a signal indicating the stoppage of the variable-length coding to the main control unit 100. The main control unit 100 receives the signal and performs a restart marker insertion procedure (steps S1005 and S1006).

When the restart marker insertion procedure has been completed, the main control unit 100 reads the count value 1 from the coding stop control unit 702, and compares the count value 1 with the total number of MCUs included in the currently-processed image. If the count value 1 is less than the total number of MCUs, the main control unit 100 outputs a variable-length coding start command to the coding start control unit 703 to repeat the variable-length coding by MCU at step S1002.

On the other hand, if the count value 1 is equal to the total number of MCUs, it is determined that all the symbols have been encoded, and the coding is terminated (step S1007).

Next, the restart marker insertion procedure at step S1006 in FIG. 2, performed by the variable-length coding unit 701 based on the instruction from the main control unit 100, will be described in detail with reference to the flowchart of FIG. 3.

As described above, the coding stop control unit 702 stops coding by the variable-length coding unit 701 when the symbols for the restart interval have been variable-length encoded, and notifies the main control unit 100 of the status where the variable-length coding unit 701 has stopped the variable-length coding. Then the main control unit 100 starts the procedure for inserting the restart marker into the variable-length coded data.

In the JPEG coding, the restart marker must exist in a byte boundary. Accordingly, if the variable-length code data is not ended in a byte boundary upon stoppage of coding by the variable-length coding unit 701, plural "1", called padding bits, must be inserted by the byte boundary. Before the number of padding bits is obtained, the number of padding bits as a variable stored in the main control unit 100 is initialized to zero (step S2001).

Next, the main control unit 100 reads the number of significant bits remaining in the data combination unit 706 at that time from the number of significant bits control unit 709, and calculates the number of bits necessary for the data to the byte boundary. To obtain the number of padding bits, first, main control unit compares the value of the number of significant bits control unit 709 with zero. If the value of the number of significant bits control unit 709 is not equal to zero, the main control unit calculates the number of padding bits at step S2003. On the other hand, if the value of the number of significant bits control unit 709 is zero, it is determined that the data in the data combination unit 706 ends in the byte boundary and no padding bit is required. Then the process proceeds to step S2004 (step S2002). The calculation of the number of padding bits is made by dividing the number of significant bits of variable-length code data, remaining in the data combination unit 706 obtained from the number of significant bits control unit 709, by 8 and obtaining a remainder (step S2003).

Next, it is determined whether or not the number of bits writable into the data combination unit 706 is greater than a value obtained by adding 16 bits necessary for the restart marker to the number of padding bits (step S2004). Note that the calculation of the number of necessary bits in the 32-bit length data combination unit 706 is made by subtracting the number of significant bits of variable-length code data remaining in the data combination unit 706 from 32.

When the data combination unit 706 becomes writable, the main control unit 100 writes the data where the padding bits and the desired restart marker are combined into the written data storage unit 704 (step S2005).

At step S2005, 0×FFD0 (16-bit length) is written as the restart marker. The lower-order 4 bits are varied within the range of 0 to 7. The actual writing of the padding bits and the restart marker into the data combination unit 706 is made by writing a value obtained by adding 16 bits necessary for the restart marker to the number of padding bits (number of bits) into the number of written bits storage unit 708, thereby the written data storage unit 704 is notified of the number of significant bits among the data written from the main control unit 100 (step S2006).

Next, prevention of addition of particular data by the data addition unit 707 to the restart marker (identifier) written from the main control unit 100 through the written data storage unit 704 and the selector 705 into the data combination unit 706 will be described with reference to FIGS. 4A to 4H and 5A to 5H.

Figure 4A:
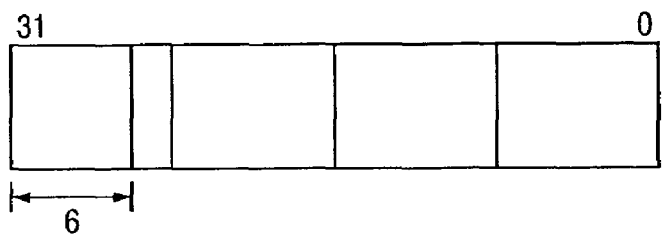
FIGS. 4A to 4H are schematic diagrams showing an identifier position tracking unit 711 in a case where padding bits and a restart marker are written into a data combination unit 706 of the image coding apparatus according to the first embodiment.

First, as described above, the coding stop control unit 702 stops coding by the variable-length coding unit 701 upon completion of coding of symbols for the restart interval. FIG. 4A shows a case where the variable-length code data remaining in the data combination unit 706 at this time is 6 bit data.

The data combination unit 706 has a 32-bit length shifter. The written data is set sequentially from the most significant bit, and outputted by 1 byte from the most significant bit to the data addition unit 707. Further, as shown in FIG. 4E, since no identifier exists in the data combination unit 706 all the 4 bits of the identifier position tracking unit 711 are zero.

Figure 4B:
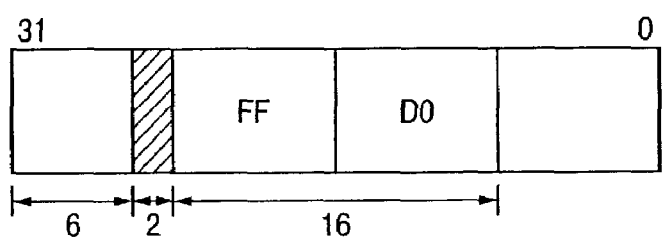

Next, FIG. 4B shows a case where 18-bit data obtained by combining 2 bit data as padding bits with 16 bit data as the desired restart marker is written from the main control unit 100 through the written data storage unit 704 and the selector 705 into the data combination unit 706. As the restart marker is written into the data combination unit 706, the identifier position generation unit 710 generates 4 bit information indicating the position of the restart marker in the 32-bit length data combination unit 706.

Figure 5A:
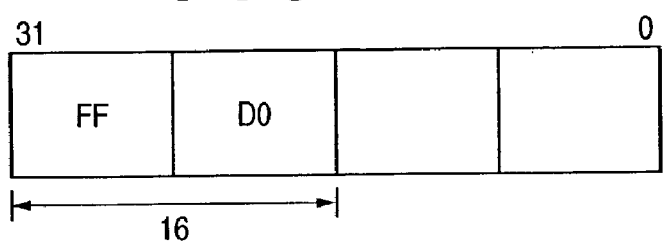
FIGS. 5A to 5H are schematic diagrams showing the relation between the position of restart marker in the data combination unit 706 and identifier position information generated by an identifier position generation unit 710 in the image coding apparatus according to the first embodiment.
Figure 5B:
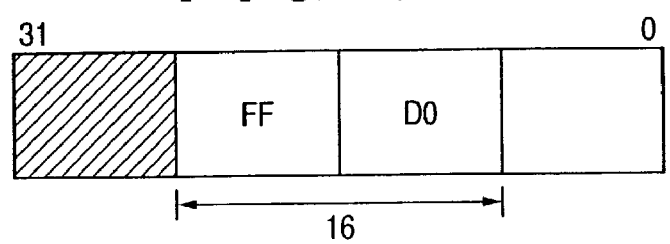
Figure 5C:
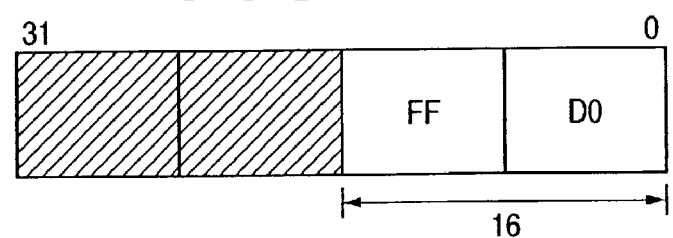
Figure 5D:
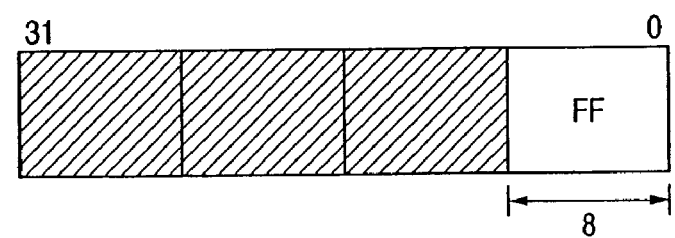
Figure 5E:
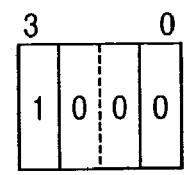

FIGS. 5A to 5H show the relation between the position of the restart marker in the data combination unit 706 and the identifier position information generated by the identifier position generation unit 710. FIGS. 5A and 5E show the 4-bit identifier position information generated by the identifier position generation unit 710 when the head byte of the restart marker exists at the highest-order byte of the data combination unit 706. As an identifier in the JPEG system always exists in a byte boundary, the position of the identifier in the 32-bit length data combination unit 706 can be indicated by 4 bits.

Figure 5F:
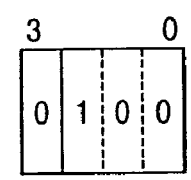
Figure 5G:
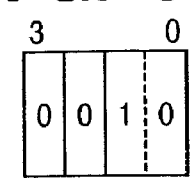
Figure 5H:
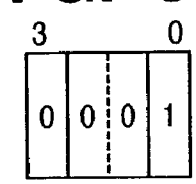

Next, FIGS. 5B and 5F show the 4-bit identifier position information generated by the identifier position generation unit 710 when the head byte of the restart marker exists at the second highest-order byte of the data combination unit 706. FIGS. 5C and 5G show the 4-bit identifier position information generated by the identifier position generation unit 710 when the head byte of the restart marker exists at the third highest-order byte of the data combination unit 706. FIGS. 5D and 5H show the 4-bit identifier position information generated by the identifier position generation unit 710 when the head byte of the restart marker exists at the lowest-order byte of the data combination unit 706.

If the restart marker is written into the data combination unit 706 as shown in FIG. 4B, the 4-bit identifier position information where the second bit is "1" is generated by the identifier position generation unit 710 as in the case of FIG. 5F and outputted to the identifier position tracking unit 711.

In the identifier position generation unit 710, the identifier position information is generated from the following expression.

$$(x\%8==0)?(y=3-(x>>3)):(y=4-(x>>3)) \quad \text{[Expression 1]}$$

In the expression, alphabet x is the number of significant bits in the data combination unit 706 obtained from the number of significant bits control unit 709, and y, the 4-bit identifier position information represented by using C++ operators. In FIG. 4B, as the padding bits with the restart markers are written into the data combination unit 706, the calculation of the identifier position information y differs based on whether or not the remainder of division of the number of significant bits x by 8 as in the expression 1 is zero.

Figure 4C:
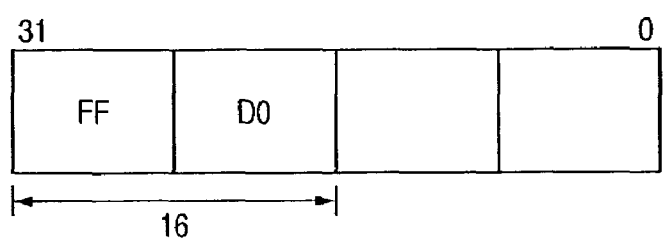
Figure 4D:
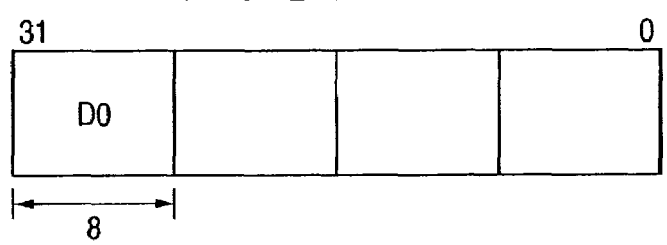
Figure 4E:
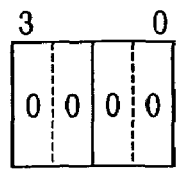
Figure 4F:
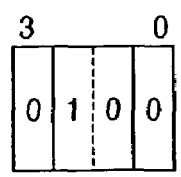
Figure 4G:
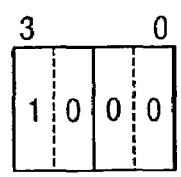

Next, FIG. 4C shows the status of the data combination unit 706 when the highest-order byte of the data combination unit 706 has been outputted to the data addition unit 707, and FIG. 4G shows the status of the identifier position tracking unit 711. At this time, the restart marker is set at the highest-order byte of the data combination unit 706, and in the identifier position tracking unit 711, the most significant bit is "1".

Figure 4H:
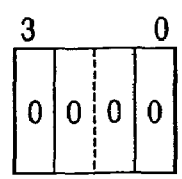

Further, FIG. 4D shows the status of the data combination unit 706 when the head byte of the restart marker has been outputted to the data addition unit 707, and FIG. 4H shows the status of the identifier position tracking unit 711. The head byte 0×FF (8-bit length) of the restart marker is outputted to the data addition unit 707 and at the same time, the most significant bit "1" in the identifier position tracking unit 711 is outputted to the data addition unit 707, thereby the data addition unit is notified that the written 0×FF (8-bit length) is the head byte data of the identifier. Then the data addition unit 707 does not add particular data to the 0×FF (8-bit length) data.

Next, moving image coding processing based on the MPEG system in the present embodiment will be described.

Prior to all the coding operation, the MPEG scheme is set as a coding scheme for the processing object image in the coding scheme storage unit 712.

First, the entire flow of generation of code data string by the variable-length encoder 700 from symbols generated by the run-length coding unit will be described. The variable-length coding unit 701 variable-length encodes symbols and generates variable-length code data. The selector 705 selects the variable-length code data or data written into the data storage unit 704 (including identifiers) and outputs the selected data to the data combination unit 706.

The data combination unit 706 connects sequentially-outputted variable-length code data or the like (variable-length code data, identifier or the like) and outputs the data by predetermined data length such as 1 byte to the data addition unit 707. The data addition unit 707 is notified from the coding scheme storage unit 712 that the processing object image is in conformity to the MPEG scheme. The data addition unit 707 does not perform any processing on the variable-length code data sequentially outputted from the data combination unit 707 and outputs the data as a code data string.

Next, a procedure by the variable-length encoder 700 for inserting an identifier into a variable-length code data under an instruction from the main control unit 100 will be described with reference to the flowchart of FIG. 12. In this example, an identifier called slice start code in the MPEG scheme which exists at the head of slice is inserted. As the slice may include plural macro blocks, the interval between occurrence of slice start code may differ in each slice.

First, in accordance with an instruction from the main control unit 100, count value 1 and count value 2 counted by the coding stop control unit 702 are initialized (steps S5001 and S5002), and the number of macro blocks to be included in the currently-processed slice is set.

Next, the main control unit 100 inserts a slice header which begins with the slice start code into the code data string (step S5003).

Further, the main control unit 100 outputs a coding start command to the variable-length coding unit 701. The variable-length coding unit 701 receives the command via the coding start control unit 703, and starts variable-length coding. The variable-length coding in the variable-length coding unit 701 is performed on the symbols generated by the run-length coding unit by macro block (step S5004).

On the other hand, every time the variable-length coding unit 701 variable-length encodes the symbols by macro block, the coding stop control unit 702 increments the count values 1 and 2 by one (step S5005).

Further, the count value 2 and the number of macro blocks in the slice are compared with each other, and if the count value 2 is less than the number of macro blocks in the slice, the process returns to step S5004 to repeat the variable-length coding by macro block.

On the other hand, if the count value 2 is equal to or greater than the number of macro blocks in the slice, the coding stop control unit 702 issues a stop command to the variable-length coding unit 701 so as to stop the variable-length coding, and outputs a signal indicating the stoppage of the variable-length coding to the main control unit 100 (step S5006).

The main control unit 100 reads the count value 1 from the coding stop control unit 702, and compares the count value 1 with the total number of slices included in the currently-processed picture. If the count value 1 is less than the total number of slices, the main control unit 100 outputs a variable-length coding start command to the coding start control unit 703 to repeat the variable-length coding by macro block at step S5002.

On the other hand, if the count value 1 is equal to the total number of MCUs, it is determined that all the symbols have been encoded, and the coding is terminated (step S5007).

Next, the slice header insertion procedure at step S5003 in FIG. 12, performed by the variable-length coding unit 701 based on the instruction from the main control unit 100, will be described in detail with reference to the flowchart of FIG. 13.

As described above, the main control unit 100 starts the procedure for inserting the slice header into the variable-length code data prior to macro block coding.

In the MPEG coding, the slice start code as an identifier at the head of the slice header must exist in a byte boundary. Accordingly, if the variable-length code data is not ended in a byte boundary upon stoppage of coding by the variable-length coding unit 701, plural "0", called padding bits, must be inserted by the byte boundary.

The main control unit 100 reads the number of significant bits remaining in the data combination unit 706 at that time from the number of significant bits control unit 709, and calculates the number of bits necessary for the data to the byte boundary. To obtain the number of padding bits, first, main control unit compares the value of the number of significant bits control unit 709 with zero. If the value of the number of significant bits control unit 709 is not equal to zero, the main control unit calculates the number of padding bits at step S6002. On the other hand, if the value of the number of significant bits control unit 709 is zero, it is determined that the data in the data combination unit 706 ends in the byte boundary and no padding bit is required. Then the process proceeds to step S6005 (step S6001).

The calculation of the number of padding bits is made by dividing the number of significant bits of variable-length code data, remaining in the data combination unit 706 obtained from the number of significant bits control unit 709, by 8 and obtaining a remainder (step S6002). The padding bits are generated from the obtained number of padding bits, and written into the written data storage unit 704 (step S6003). Further, the number of padding bits is written into the number of bits storage unit 708, thereby the padding bits are actually written into the data combination unit 706 and the variable-length code data existing in the data combination unit 706 ends in the byte boundary (step S6004).

Next, to write the 32-bit slice start code into the data combination unit 706, it is determined whether or not there is no significant variable-length code data remaining the data combination unit 706 indicated by the number of significant bits control unit 709 (step S6005).

When the data combination unit 706 becomes writable, the main control unit 100 writes the desired slice start code into the written data storage unit 704 (step S6006). Then, the unit writes 32 as the bit length of the slice start code into the number of written bits storage unit 708, thereby the slice start code is actually written into the data combination unit 706 (step S6007).

In the slice header, a 5-bit quantization scaling value and a subsequent 1-bit "0" must follow the slice start code. To write the 6-bit header information into the data combination unit 706, the main control unit 100 determines that the value obtained by subtracting the significant variable-length code data remaining in the data combination unit 706 from 32 is equal to or greater than 6 (step S6008).

When the data combination unit 706 becomes writable, the main control unit 100 writes the 6-bit data including the quantization scaling value into the written data storage unit 704 (step S6009). Then the unit writes 6 as the number of bits, obtained by adding the quantization scaling value 5 bits to 1 bit, into the number of written bits storage unit 708, thereby actually writes the data into the data combination unit 706 (step S6010).

As described above, the conventional variable-length coding unit comprises a specialized hardware device and has a large circuit scale, whereas in the present embodiment, a part of processing by the variable-length coding unit (e.g. a function of controlling the flow of processing or a function of setting data to be inserted) is assigned to the main control unit, thereby the circuit scale can be reduced. Further, as a part of the processing is assigned to the main control unit, the data to be inserted (identifier such as the restart marker or the slice start code) can be changed or insertion timing (the start interval or the number of macro blocks in slice) can be changed in accordance with coding scheme. Accordingly, in the present embodiment, the insertion of restart marker in the JPEG scheme and the insertion of slice header in the MPEG scheme have been described, however, insertion of EOI marker or DNL marker in the JPEG scheme, insertion of picture header necessary in the picture layer as a higher order layer of the slice layer in the MPEG scheme, or insertion of identifier in other different coding schemes can be performed by changing the insertion timing and insertion data.

<Code Amount Control in Image Coding Apparatus>

Next, the code amount control in the image coding apparatus having the above-described variable-length encoder 700 will be described.

Figure 11:
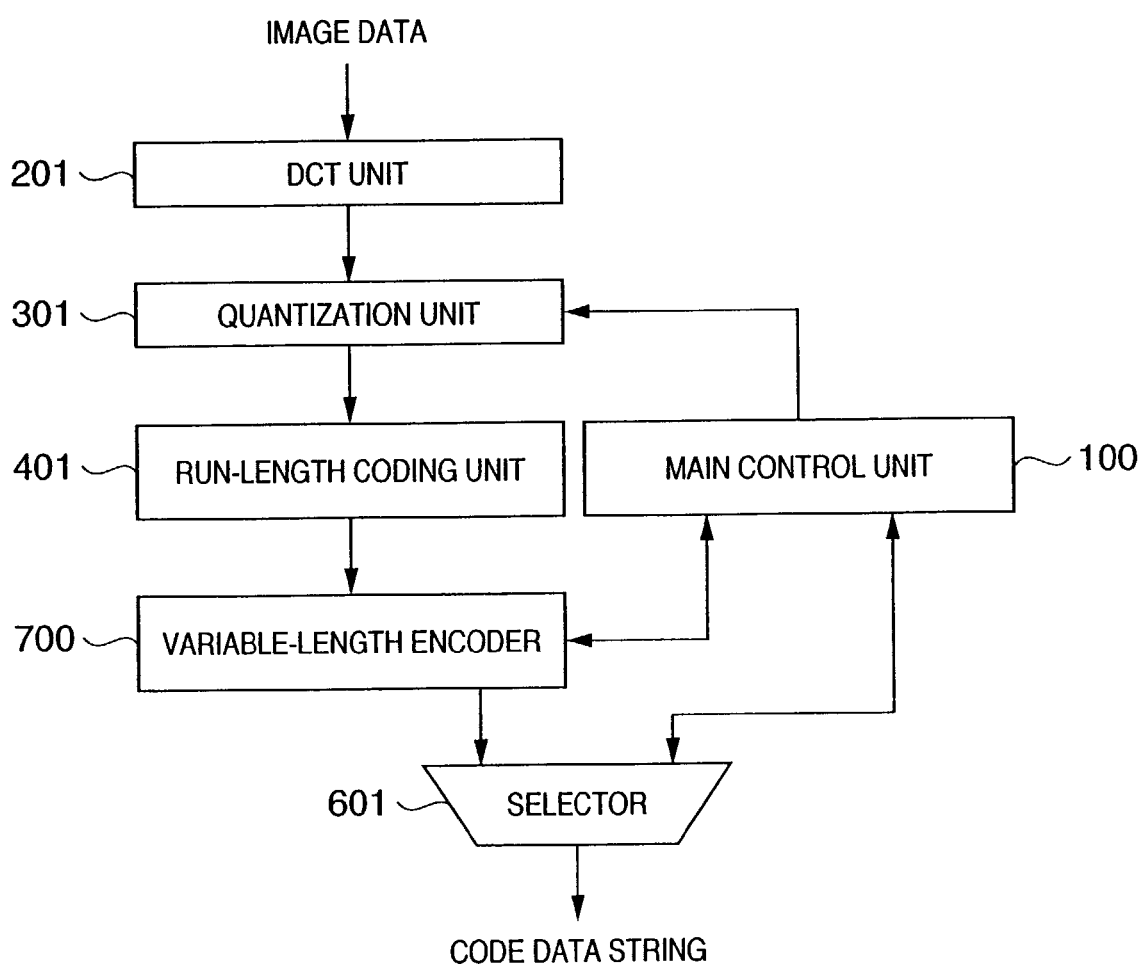
FIG. 11 is a block diagram showing the image coding apparatus according to the first embodiment of the present invention.

FIG. 11 is a block diagram showing the image coding apparatus according to the first embodiment of the present invention. First, a header portion outputted from the main control unit 100 is selected by the selector 601 and outputted to the outside. Thereafter, image data input is started, and coding is performed on the ECS in the JPEG system or the picture layer in the MPEG system. Numeral 201 denotes a DCT unit which converts the input image data to DCT coefficients. The DCT coefficients are quantized by a quantization unit 301. At this time, the quantization value is set from the main control unit 100.

After the quantization by the quantization unit 301, the quantized values are converted by a run-length coding unit 401 into symbol of run-length and level, and inputted into the above-described variable-length encoder 700.

Figure 2:
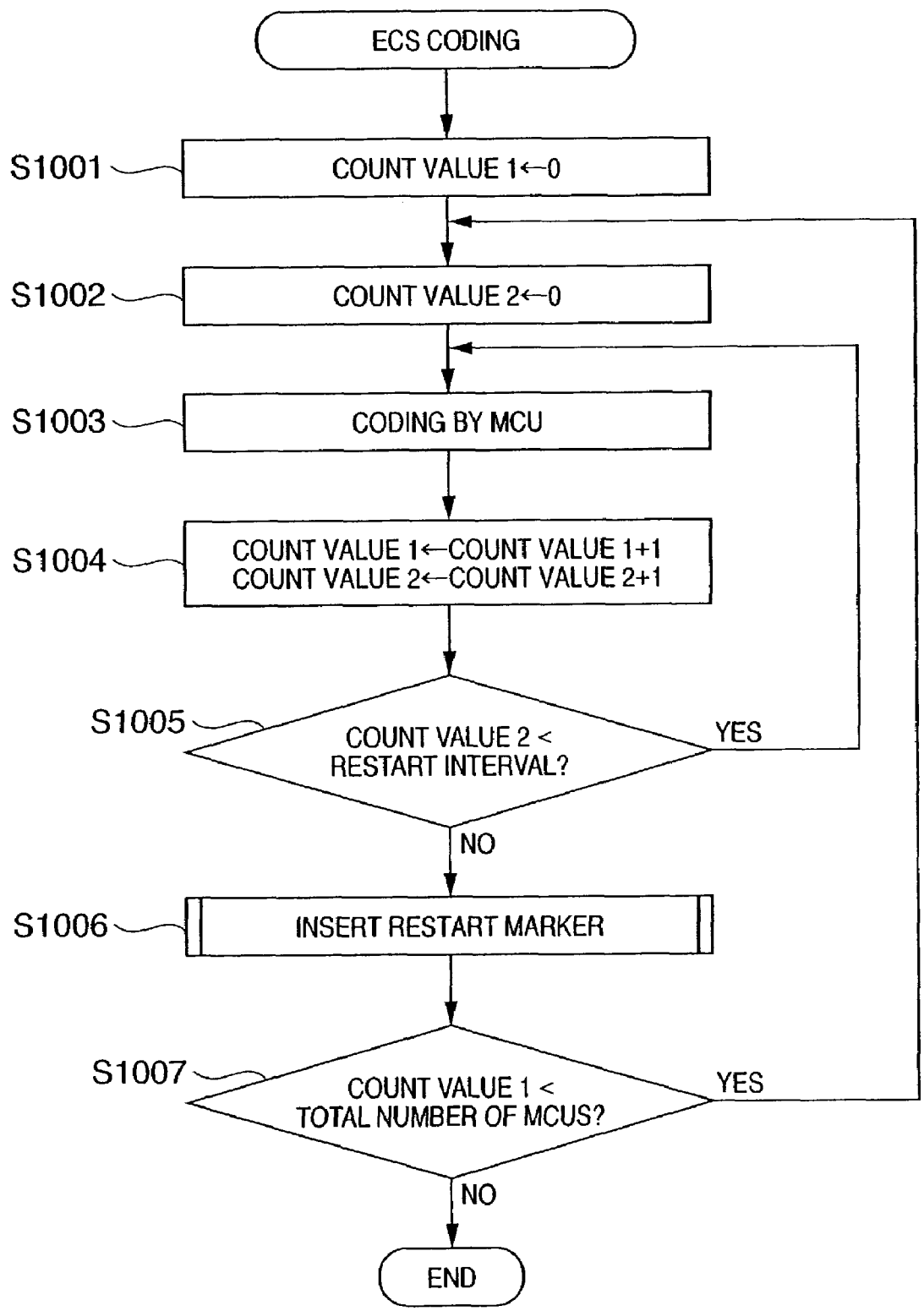
FIG. 2 is a flowchart showing a processing procedure for inserting an identifier in the JPEG system into a code data string by a main control unit 100 of the image coding apparatus according to the first embodiment.
Figure 3:
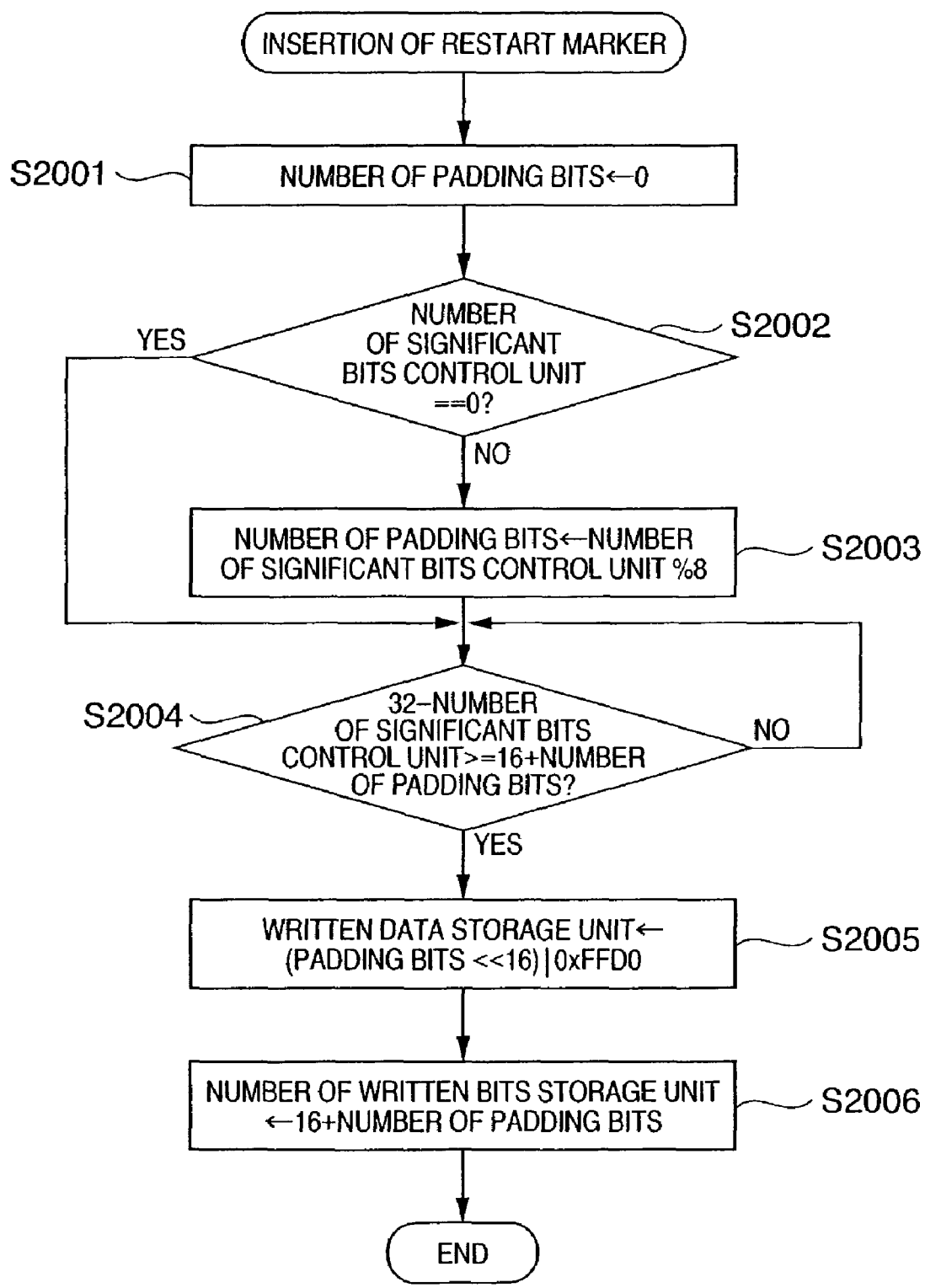
FIG. 3 is a flowchart showing in detail restart marker insertion in the processing procedure by the main control unit 100 of the image coding apparatus according to the first embodiment.
Figure 10:
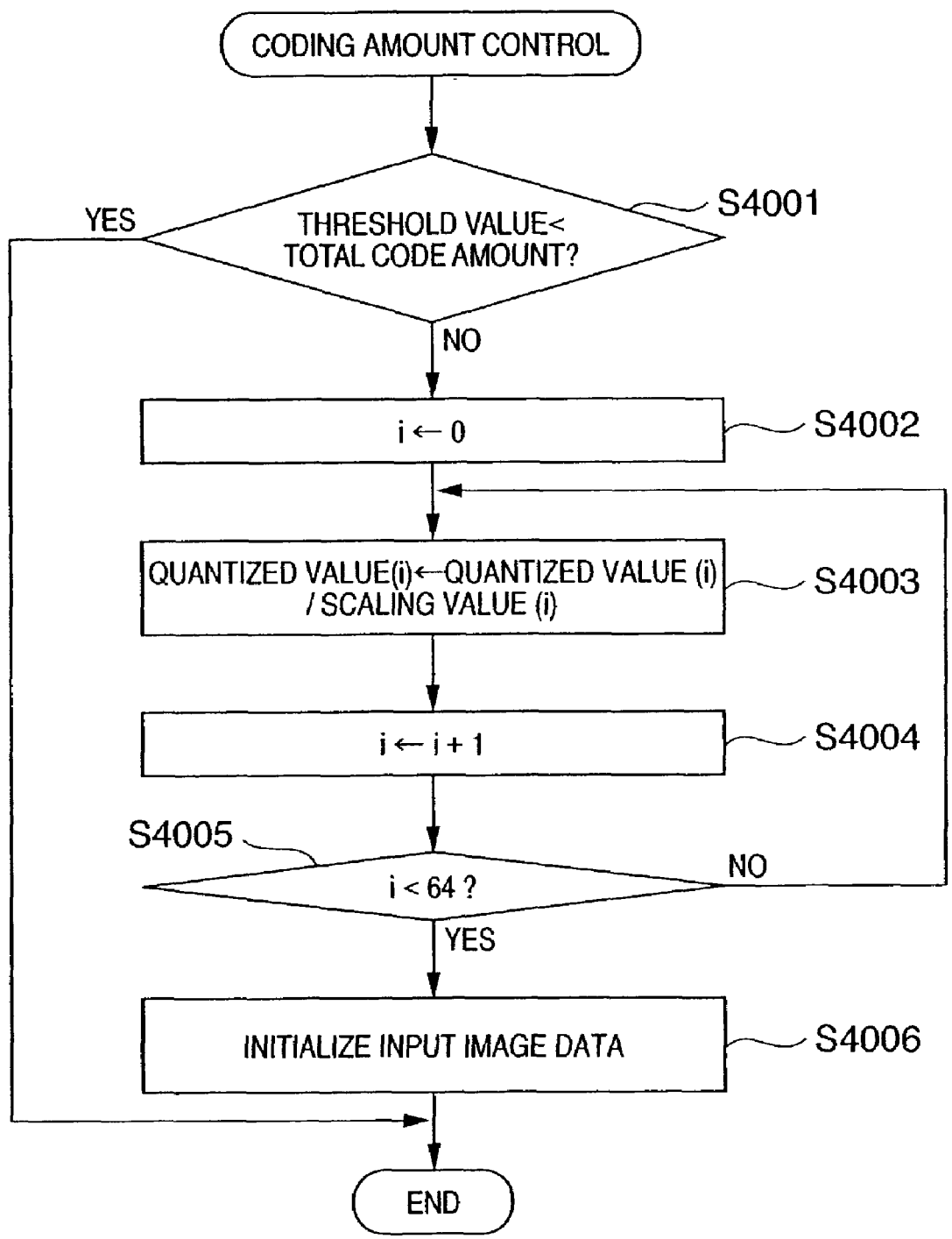
FIG. 10 is a flowchart showing a code amount control procedure in the image coding apparatus according to the first embodiment of the present invention.

At step S1006 in FIG. 2, in the status where coding is temporarily stopped for restart marker insertion or slice header insertion, the code amount control as shown in FIG. 10 is performed.

First, the main control unit 100 reads the total code amount of code data string outputted until the stoppage of the coding, counted by the data addition unit 707, and compares the amount with a predetermined threshold value (step S4001). If the total code amount is less than the threshold value, the procedure of the code amount control is terminated, while if the total code amount is equal to or greater than the threshold value, the code amount control procedure is started, and quantization values set in the quantization unit 300 are re-set at steps S4002 to S4005.

In the re-setting of the quantization value, first, a quantization value index i is initialized to zero (step S4002). Next, the quantization value currently set in the quantization unit 300 is divided by an arbitrary scaling value, and the quantization value is written into the quantization unit 300 (step S4003). Then the process proceeds to step S4004.

At step S4004, the index i is incremented by 1, and steps S4003 and S4004 are repeated until all the 64 quantization values corresponding to the 8×8 pixel block are re-set (step S4005). When the resetting of all the quantization values has been completed, initialization is performed so as to input the image data again (step S4006).

As described above, in the conventional image coding apparatus, once coding of ECS or picture layer is started, the apparatus self-operates until all the symbols are encoded in the variable-length coding unit, whereas in the present embodiment, the code amount can be evaluated even if all the symbols have not been encoded, by performing processing while checking the total code amount by MCU, macro block or slice.

<Abnormality Determination by Variable-Length Coding Unit and Control Unit>

Next, a description will be made about a procedure for detecting a mishap of coding due to some factor during coding of ECS in the JPEG scheme or coding of picture layer in the MPEG scheme and performing adaptive control, in the image coding apparatus according to the present embodiment.

In the above description, the number of significant bits in the data combination unit 706 is read from the number of significant bits control unit 709 in the status where the variable-length coding is stopped by the coding stop control unit 702. In this example, the number of significant bits can also be read during variable-length coding.

The main control unit 100 counts the number of cycles (the number of MCUs or macro blocks) in the period of insertion of restart marker or slice header, and stores a mean value as a required cycle mean value. In the interval of insertion of arbitrary restart marker or slice header, if the notification of stoppage has not sent from the coding stop control unit 702 even when coding is continued for the required cycle mean value by a predetermined threshold or more, the number of significant bits in the data combination unit 706 is repeatedly read a predetermined number of times through the number of significant bits control unit 709.

If the number of significant bits has been less than 8 and not changed in the predetermined number of times of reading, it is determined that there is a mishap in the processing upstream of the data combination unit 706. On the other hand, if the number of significant bits has been equal to or greater than 8 and not changed, it is determined that there is a mishap in the processing downstream of the data combination unit 706. Based on the result of determination, the main control unit 100 adaptively controls the processing thereafter by inspection of the respective hardware devices or the like.

If the number of significant bits has been changed in the predetermined number of times of reading, the main control unit 100 determines that the coding processing is normally continued. Note that in the present embodiment, the main control unit 100 reads the number of significant bits at the interval of insertion of restart marker or slice header, however, finer control can be made by reading the number of significant bits at an interval of processing on MCU or macro block.

Second Embodiment

<Coding by Variable-Length Coding Unit and Control Unit>

Figure 6:
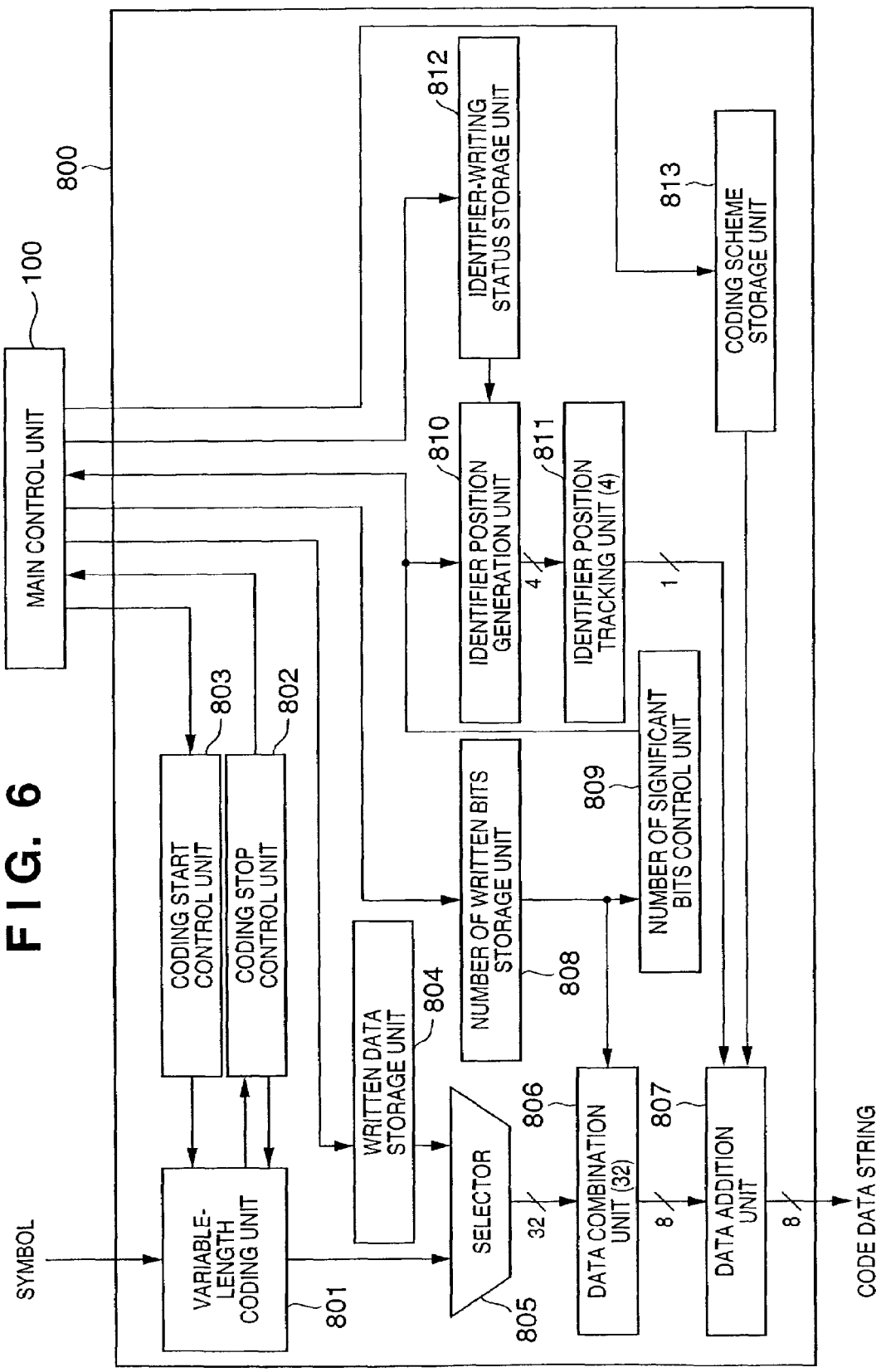
FIG. 6 is a block diagram showing the image coding apparatus according to a second embodiment of the present invention.

FIG. 6 is a block diagram showing the image coding apparatus according to a second embodiment of the present invention. In the variable-length coding unit shown in FIG. 6, numeral 801 denotes a variable-length coding unit which performs variable-length coding on symbols of level and run-length generated by a run-length encoder; 802, a coding stop control unit which stops coding based on the number of symbols processed by the variable-length coding unit 801 and notifies the main control unit 100 that the variable-length coding unit 801 has stopped the coding processing.

Further, numeral 803 denotes a coding start control unit which sends an instruct from the main control unit 100 to the variable-length coding unit 801 to start the coding processing; and 804, a written data storage unit in which data written from the main control unit 100 is stored.

Further, numeral 805 denotes a selector which selects one of variable-length code data outputted from the variable-length coding unit 801 or data outputted from the written data storage unit 804; and 806, a 32-bit length data combination unit for connection of data selected by the selector 805.

Further, numeral 807 denotes a data addition unit which adds a particular data pattern to an identifier if it detects a pattern identical to the identifier in a data string outputted from the data combination unit 806; 808, a number of written bits storage unit in which the number of bits of data, written from the main control unit 100 into the data combination unit 806, is stored; 809, a number of significant bits control unit which counts and stores the number of significant bits in the data combination unit 806; 810, an identifier position generation unit which generates 4-bit identifier position information indicating the position of identifier, written from the main control unit 100 through the written data storage unit 804 and the selector 805, in the 32-bit length data combination unit 806; and 811, an identifier position tracking unit which tracks the 4-bit identifier position information outputted from the identifier position generation unit 810 based on the operation of the data combination unit 806.

Further, numeral 812 denotes an identifier-writing status storage unit used for storing a status where an identifier is written from the main control unit 100 through the written data storage unit 804 and the selector 805 into the data combination unit 806.

Further, numeral 813 denotes a coding scheme storage unit used for notifying the coding scheme of processing object image such as JPEG or MPEG scheme, from the main control unit 100 to the variable-length encoder 800.

First, still image coding processing by the JPEG scheme in the present embodiment will be described.

Prior to all the coding operation, the JPEG scheme is set as a coding scheme for the processing object image in the coding scheme storage unit 813.

Figure 7:
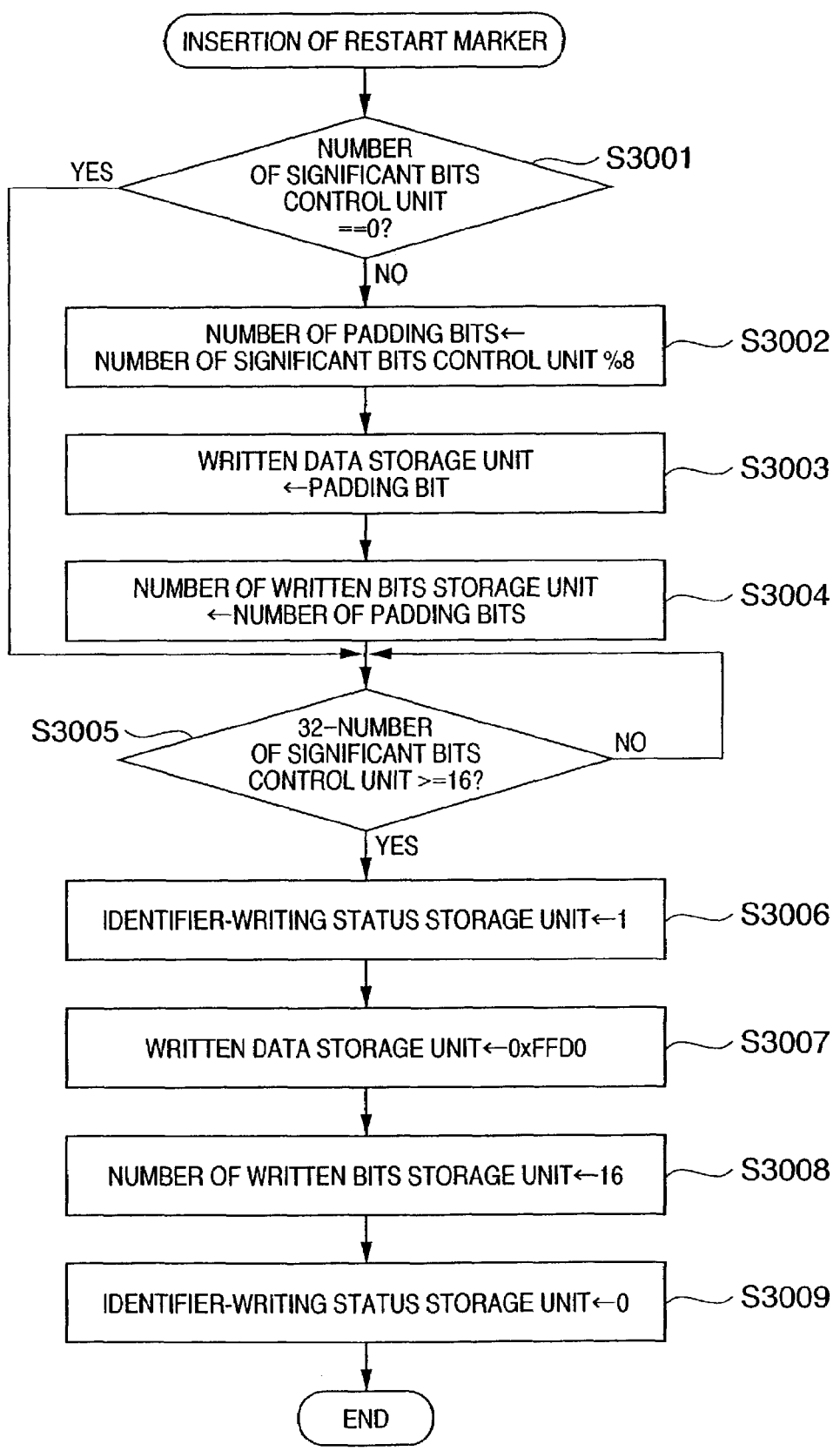
FIG. 7 is a flowchart showing in detail the restart marker insertion in the processing procedure by the main control unit 100 of the image coding apparatus according to the second embodiment.

In the present embodiment, in the procedure for insertion of identifier into code data string by the main control unit 100, as the restart marker insertion procedure shown at step S1006 in FIG. 2 is different from that of the first embodiment, the procedure will be described with reference to the flowchart of FIG. 7.

First, the coding stop control unit 802 stops coding by the variable-length coding unit 801 when the symbols for the restart interval have been variable-length encoded, and notifies the main control unit 100 of the status where the variable-length coding unit 801 has stopped the variable-length coding.

The main control unit 100 notified of the status where the variable-length coding unit 801 has stopped the variable-length coding starts the procedure for inserting the restart marker into the variable-length code data. In the JPEG coding, as the restart marker must exist in a byte boundary, if the variable-length code data is not ended in a byte boundary upon stoppage of coding by the variable-length coding unit 801, plural "1", called padding bits, must be inserted by the byte boundary.

First, the number of significant bits remaining in the data combination unit 806 is read from the number of significant bits control unit 809 at that time, and the number of bits necessary for the data to the byte boundary is calculated. To obtain the number of padding bits, first, the value of the number of significant bits control unit 809 is compared with zero. If the value of the number of significant bits control unit 809 is not equal to zero, the number of padding bits is calculated at steps S3002 to 3004. The padding bits are written into the data combination unit 806 by using the written data storage unit 804 and the written bits storage unit 808.

On the other hand, if the value of the number of significant bits control unit 809 is zero, it is determined that the data in the data combination unit 806 ends in the byte boundary and no padding bit is required. Then the process proceeds to step S3005 (step S3001).

The calculation of the number of padding bits is made by dividing the number of significant bits of variable-length code data, remaining in the data combination unit 806 obtained from the number of significant bits control unit 809, by 8 and obtaining a remainder (step S3002). The padding bits are generated based on the obtained number of padding bits, and written into the written data storage unit 804 (step S3003). Further, as the number of padding bits is written into the number of written bits storage unit 808, the padding bits are actually written into the data combination unit 806, thereby the variable-length code data string existing in the data combination unit 806 ends in the byte boundary (step S3004).

Next, it is determined whether or not the number of bits writable into the data combination unit 806 is greater than a value obtained by adding 16 bits necessary for the restart marker (step S3005). Note that the calculation of the number of necessary bits in the 32-bit length data combination unit 806 is made by subtracting the number of significant bits of variable-length code data remaining in the data combination unit 806 from 32.

When the data combination unit 806 becomes writable, the main control unit 100 writes "1" into the identifier-writing status storage unit 812, and notifies the identifier position generation unit 810 of additional writing of the identifier to the variable-length code string which ends in the byte boundary (step S3006).

Thereafter, the desired restart marker is written into the written data storage unit 804 (step S3007). At step S3007, 0xFFD0 (16-bit length) is written as the restart marker. The lower-order 4 bits are varied within the range of 0 to 7. The actual writing of the padding bits and the restart marker into the data combination unit 806 is made by writing 16 as the bit-length of the restart marker into the number of written bits storage unit 808 (step S3008).

Finally, "0" is written into the identifier-writing status storage unit 812, and the identifier position generation unit 810 is notified of completion of writing of identifier (step S3009).

Next, prevention of addition of particular data by the data addition unit 807 to the restart marker (identifier) written from the main control unit 100 through the written data storage unit 804 and the selector 805 into the data combination unit 806 will be described with reference to FIGS. 8A to 8J.

Figure 8A:
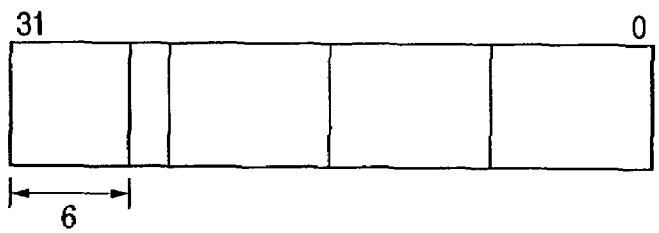
FIGS. 8A to 8J are schematic diagrams showing an identifier position tracking unit 811 in a case where padding bits and a restart marker are written into a data combination unit 806 of the image coding apparatus according to the second embodiment.

First, as described above, the coding stop control unit 802 stops coding by the variable-length coding unit 801 upon completion of coding of symbols for the restart interval. FIG. 8A shows a case where the variable-length code data remaining in the data combination unit 806 at this time is 6 bit data.

Figure 8F:
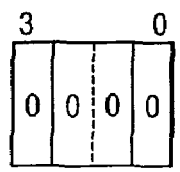

The data combination unit 806 has a 32-bit length shifter. The written data is set sequentially from the most significant bit, and outputted by 1 byte from the most significant bit to the data addition unit 807. Further, as shown in FIG. 8F, since no identifier exists in the data combination unit 806, all the 4 bits of the identifier position tracking unit 811 are zero.

Figure 8B:
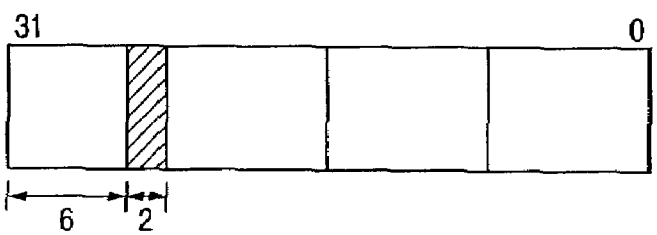
Figure 8G:
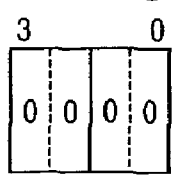

Next, FIG. 8B shows a case where 2-bit "1" as padding bits are written from the main control unit 100 through the written data storage unit 804 and he selector 805 into the data combination unit 806, and the variable-length code data string in the data combination unit 806 ends in a byte boundary. As shown in FIG. 8G, all the 4 bits of the identifier position tracking unit 811 are zero.

Figure 8C:
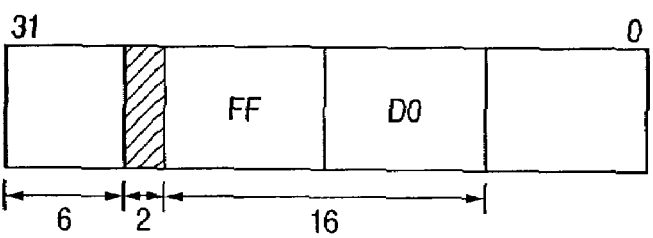

Next, FIG. 8C shows a case where the desired 16-bit restart marker is written from the main control unit 100 through the written data storage unit 804 and the selector 805 into the data combination unit 806. Since the identifier position generation unit 810 has been previously notified from the main control unit 100 that the identifier is written through the identifier-writing status storage unit 812, the identifier position generation unit 810 is informed of the status where the variable-length code data string in the data combination unit 806 ends in the byte boundary. Accordingly, the identifier position generation unit 810 generates the identifier position information by the following expression 2.

$$y=3-(x>>3) \quad \text{[Expression 2]}$$

In the expression, alphabet x is the number of significant bits in the data combination unit 806 obtained from the number of significant bits control unit 809, and y, the 4-bit identifier position information represented by using C++ operators. Note that since the identifier position generation unit 810 has been previously notified from the main control unit 100 that the identifier is written through the identifier-writing status storage unit 812, in the variable-length encoder 800 having the identifier position generation unit 810, the identifier position information can be obtained by further simple calculation in comparison with the variable-length encoder 700 without the identifier position generation unit 810. The identifier position information in a case where the data combination unit 806 is in the status as shown in FIG. 8C is calculated by the following expression 3.

$$y=3-(8>>3)=3-1=2 \quad \text{[Expression 3]}$$

Figure 8H:
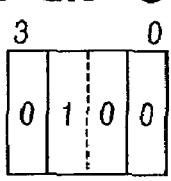
Figure 8D:
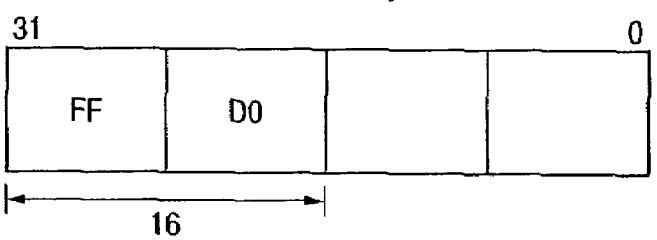
Figure 8I:
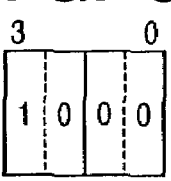

As the identifier position information is "2" from the expression 3, the 4-bit information where the second bit is "1" is outputted from the identifier position generation unit 810 to the identifier position tracking unit 811 as shown in FIG. 8H. Next, FIG. 8D shows the status of the data combination unit 806 when the highest order byte of the data combination unit 806 has been outputted to the data addition unit 807, and FIG. 8J shows the status of the identifier position tracking unit 811. At this time, the restart marker is set from the highest order byte of the data combination unit 806, and the most significant bit in the identifier position tracking unit 811 is "1".

Figure 8E:
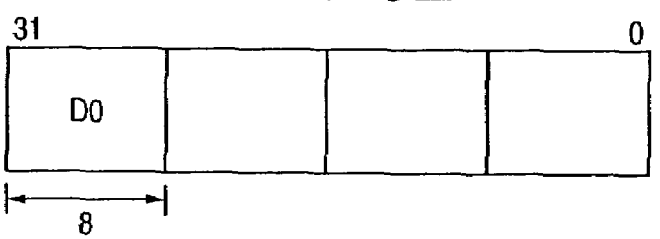
Figure 8J:
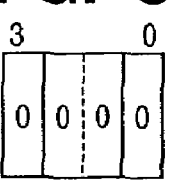
Figure 9:
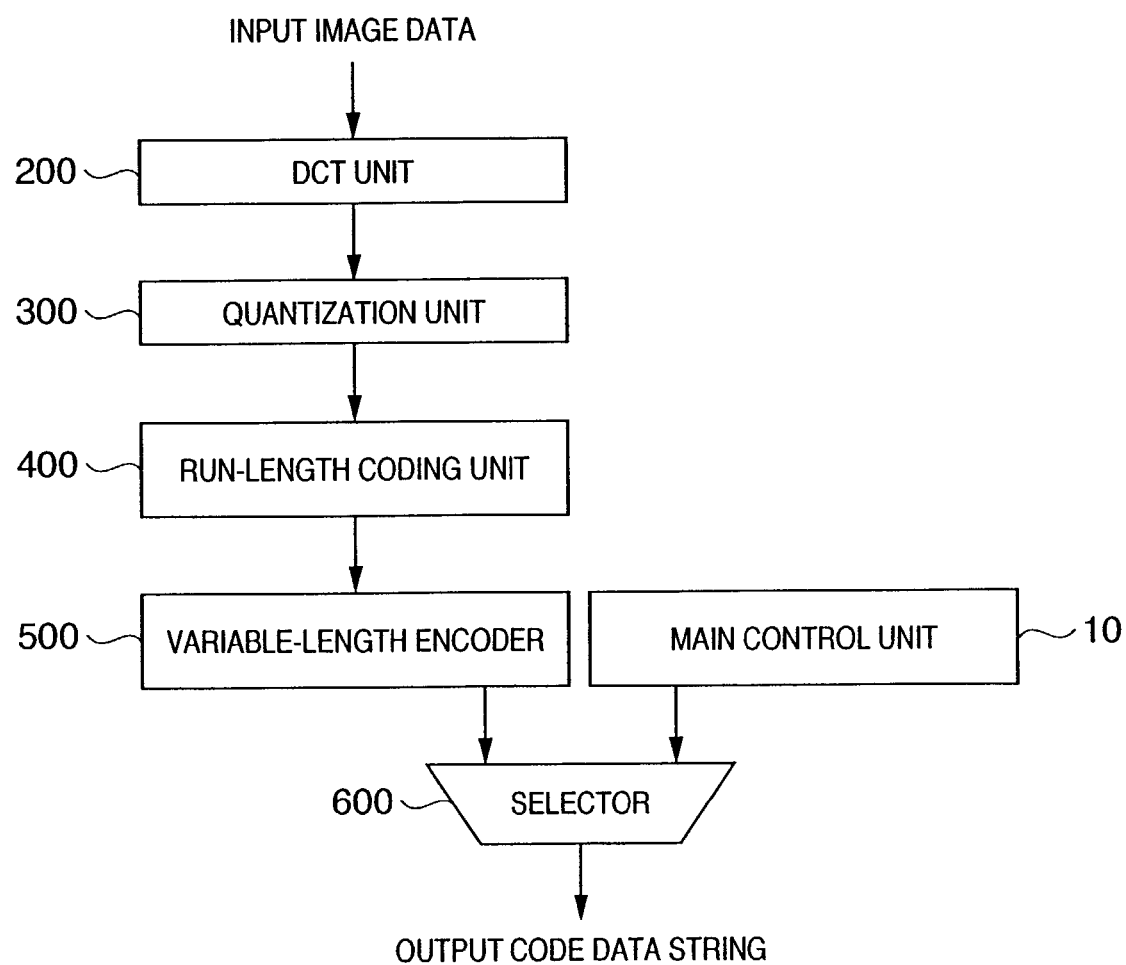
FIG. 9 is a block diagram showing the conventional image coding apparatus in conformity to the JPEG system.

Further, FIG. 8E shows the status of the data combination unit 806 when the head byte of the restart marker has been outputted to the data addition unit 807, and FIG. 8J, the status of identifier position tracking unit 811. The head byte 0xFF (8-bit length) of the restart marker is outputted to the data addition unit 807 and at the same time, the most significant bit "1" in the identifier position tracking unit 811 is outputted to the data addition unit 807, thereby it is notified that the written 0xFF (8-bit length) is the head byte data of the identifier. Then the data addition unit 807 does not add particular data to the 0xFF (8-bit length) data.

Next, moving image coding processing based on the MPEG scheme in the present embodiment will be described.

Prior to all the coding operation, the MPEG scheme is set as a coding scheme for the processing object image in the coding scheme storage unit 813.

Figure 12:
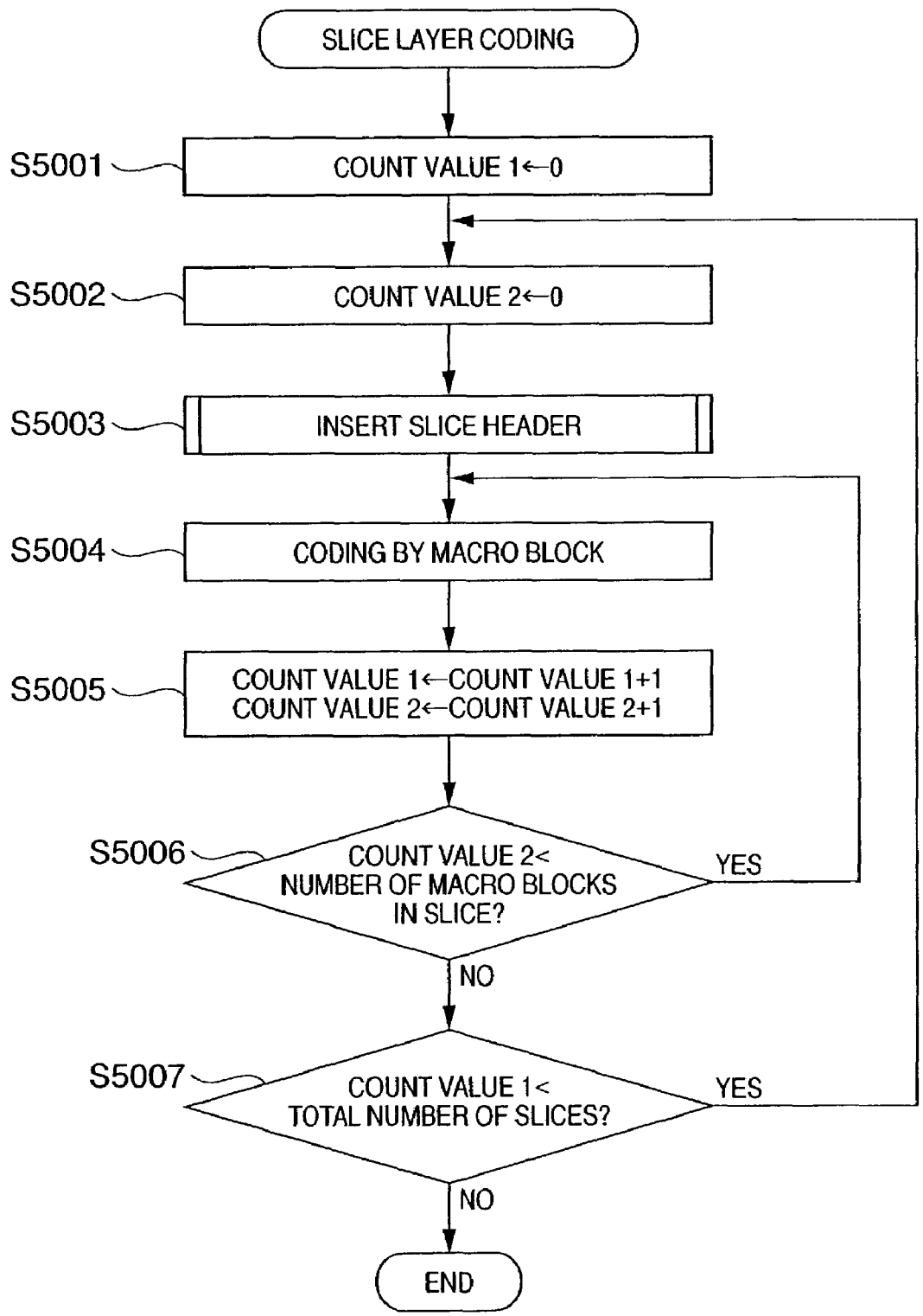
FIG. 12 is a flowchart showing a processing procedure for inserting an identifier on the MPEG system into a code data string by the main control unit 100 of the image coding apparatus according to the first embodiment.
Figure 13:
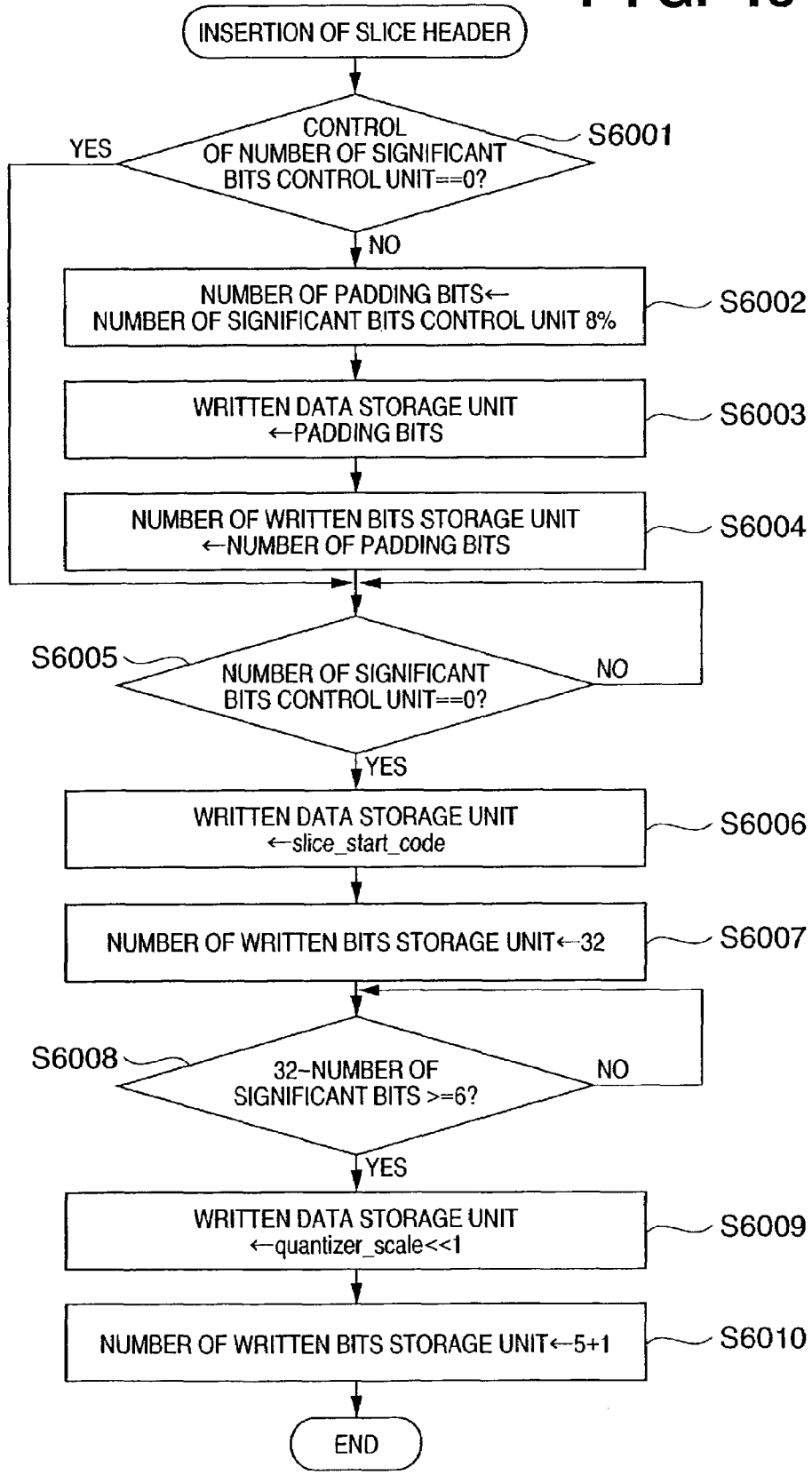
FIG. 13 is a flowchart showing in detail a slice header insertion in the processing procedure by the main control unit 100 of the image coding apparatus according to the first embodiment.

In the present embodiment, in the procedure for insertion of identifier into code data string by the main control unit 100, the slice header insertion procedure shown at step S5003 in FIG. 12 is the same as that of the first embodiment and a slider header is inserted by a procedure shown in the flowchart of FIG. 13. Accordingly, the explanation thereof will be omitted.

As described above, in the image coding apparatus having the construction of the present embodiment, since the identifier position generation unit 810 has been previously notified of identifier in the JPEG scheme from the main control unit 100 through the identifier-writing status storage unit 812 of writing, the identifier position generation unit 810 obtains the identifier position information by further simple calculation in comparison with that of the first embodiment, which further reduces the circuit scale.

As described above, the present invention provides a variable-length coding apparatus having a further reduced circuit scale, which flexibly handles different identifier insertion procedures in various coding schemes, and which performs fine code amount control and adaptive erroneous operation control, and an image coding apparatus having the variable-length coding apparatus.

As many apparently widely different embodiments of the present invention can be made without departing from the spirit and scope thereof, it is to be understood that the invention is not limited to the specific embodiments thereof except as defined in the appended claims.

What is claimed is:

1. A variable-length coding apparatus which converts quantized data obtained by quantizing image data into variable-length code data and generates a code data string having a predetermined data structure, comprising:

coding scheme storage means for storing a coding scheme of said code data string;

written data storage means for storing externally-input written data formed with an identifier or a combination of padding bit and identifier;

selection means for selecting said written data if the written data is written into said written data storage means, otherwise, selecting said variable-length code data;

data combination means for combining data selected by said selection means and generating a data string;

number of bits storage means for storing the number of bits of said externally-input written data; and number of significant bits control means for calculating the number of significant bits in the data string generated by said data combination means and outputting the number as a signal to outside.

2. The variable-length coding apparatus according to claim 1, further comprising:

variable-length coding means for converting said quantized data into the variable-length code data by a arbitrary processing unit;

coding stop control means for stopping processing by said variable-length coding means based on the amount of code processed by said variable-length coding means, and outputting a signal indicating that the processing has been stopped to the outside; and coding start control means for starting the processing by said variable-length coding means based on an external signal.

3. The variable-length coding apparatus according to claim 1, further comprising:

identifier position generation means for generating identifier position information on the position of said identifier in the data string generated by said data combination means;

identifier position tracking means for tracking the identifier position information generated by said identifier position generation means based on an operation of said data combination means and outputting the result of tracking; and data addition means for detecting whether or not a pattern identical to said identifier is included in said data string outputted from said data combination means, and if the pattern is included, adding a predetermined data pattern to said identifier based on the result of tracking from said identifier position tracking means thereby generating the code data string.

4. The variable-length coding apparatus according to claim 1, further comprising:

identifier-writing status storage means for storing information on the position of said identifier in the data string generated by said data combination means;

identifier position tracking means for tracking the identifier position information generated by said identifier-writing status storage means based on an operation of said data combination means and outputting the result of tracking; and data addition means for detecting whether or not a pattern identical to said identifier is included in said data string generated by said data combination means, and if the pattern is included, adding a predetermined data pattern to said identifier based on the result of tracking from said identifier position tracking means thereby generating the code data string.

5. A variable-length coding method in a variable-length coding apparatus which converts quantized data obtained by quantizing image data into variable-length code data and generates a code data string having a predetermined data structure, comprising:

a coding scheme storage step of storing a coding scheme of said code data string;

a written data storage step of storing externally-input written data formed with an identifier or a combination of padding bit and identifier;

a selection step of selecting said written data if the written data is written at said written data storage means, otherwise, selecting said variable-length code data;

a data combination step of combining data selected a said selection step and generating a data string;

a number of bits storage step of storing the number of bits of said externally-input written data; and a number of significant bits control step of calculating the number of significant bits in the data string generated a said data combination step and outputting the number as a signal to outside.

6. The variable-length coding method according to claim 5, further comprising:

a variable-length coding step of converting said quantized data into the variable-length code data by a arbitrary processing unit;

a coding stop control step of stopping processing at said variable-length coding step based on the amount of code processed at said variable-length coding step, and outputting a signal indicating that the processing has been stopped to the outside; and a coding start control step of starting the processing by said variable-length coding means based on an external signal.

7. The variable-length coding method according to claim 5, further comprising:

a identifier position generation step of generating identifier position information on the position of said identifier in the data string generated at said data combination step;

an identifier position tracking step of tracking the identifier position information generated at said identifier position generation step based on an operation of said data combination means and outputting the result of tracking; and a data addition step of detecting whether or not a pattern identical to said identifier is included in said data string outputted at said data combination step, and if the pattern is included, adding a predetermined data pattern to said identifier based on the result of tracking at said identifier position tracking step thereby generating the code data string.

8. The variable-length coding method according to claim 5, further comprising:

an identifier-writing status storage step of storing information on the position of said identifier in the data string generated at said data combination step;

an identifier position tracking step of tracking the identifier position information generated at said identifier-writing status storage step based on an operation at said data combination step and outputting the result of tracking; and a data addition step of detecting whether or not a pattern identical to said identifier is included in said data string generated at said data combination step, and if the pattern is included, adding a predetermined data pattern to said identifier based on the result of tracking at said identifier position tracking step thereby generating the code data string.

* * * * *

UNITED STATES PATENT AND TRADEMARK OFFICE
CERTIFICATE OF CORRECTION

PATENT NO. : 7,375,661 B2
APPLICATION NO. : 10/245766
DATED : May 20, 2008
INVENTOR(S) : Yukio Chiba et al.

It is certified that error appears in the above-identified patent and that said Letters Patent is hereby corrected as shown below:

ON THE TITLE PAGE ITEM (54) TITLE:

Title, "THEROF" should read --THEREOF--.

COLUMN 1:

Line 4, "THEROF" should read --THEREOF--; and
Line 59, "is always exists" should read --always exists--.

COLUMN 12:

Line 8, "not" should read --not been--.

COLUMN 13:

Line 54, "3004." should read --S3004.--.

COLUMN 14:

Line 55, "he" should read --the--.

COLUMN 15:

Line 32, "FIG. 8J" should read --FIG. 8I--.

COLUMN 16:

Line 40, "a" should read --an--.

UNITED STATES PATENT AND TRADEMARK OFFICE
CERTIFICATE OF CORRECTION

PATENT NO. : 7,375,661 B2
APPLICATION NO. : 10/245766
DATED : May 20, 2008
INVENTOR(S) : Yukio Chiba et al.

It is certified that error appears in the above-identified patent and that said Letters Patent is hereby corrected as shown below:

<u>COLUMN 17</u>:

Line 31, "selected a" should read --selected at--;
Line 36, "a" should read --at--; and
Line 42, "a" should read --an--.

<u>COLUMN 18</u>:

Line 9, "a" should read --an--.

Signed and Sealed this

Seventeenth Day of March, 2009

JOHN DOLL
*Acting Director of the United States Patent and Trademark Office*